United States Patent [19]

Antoon

[11] Patent Number: 4,870,751
[45] Date of Patent: Oct. 3, 1989

[54] METHOD OF MANUFACTURING PRINTED CIRCUIT BOARDS

[75] Inventor: Mattelin Antoon, Oostkamp, Belgium

[73] Assignee: Siemens Aktiengesellschaft, Berlin and Munich, Fed. Rep. of Germany

[21] Appl. No.: 176,325

[22] Filed: Mar. 31, 1988

[30] Foreign Application Priority Data

Apr. 24, 1987 [DE] Fed. Rep. of Germany ....... 3713792

[51] Int. Cl.$^4$ .......................... H05K 3/02; H05K 3/10
[52] U.S. Cl. ........................................ 29/846; 29/852; 427/43.1; 427/54.1; 430/315; 430/417
[58] Field of Search ................ 106/1.11; 174/68.5; 427/43.1, 54.1, 97, 98, 304–306, 443.1; 430/296, 315, 417; 29/846, 847, 852

[56] References Cited

U.S. PATENT DOCUMENTS 4,085,285  4/1978  Lippits et al. .................. 174/68.5
4,668,532  5/1987  Moisan et al. .................. 427/97

FOREIGN PATENT DOCUMENTS 0182193  5/1986  European Pat. Off. .
0180101  7/1986  European Pat. Off. .

OTHER PUBLICATIONS

Article entitled "Kunstostoffe in der Elecktrotechnik", AEG-TELEFUNKEN Handbucher, vol. 22, 1979, pp. 36 and 37.
Article entitled "Laser-Bildubertragung", a German periodical Glavanotechnik 77, 1986, No. 1, pp. 51–60.
Article entitled "Selective Electroless Plating by Selective Deactivation", an RCA review, vol. 31, Jun. 1970, pp. 439–442.

Primary Examiner—Timothy V. Eley
Attorney, Agent, or Firm—Hill, Van Santen, Steadman & Simpson

[57] ABSTRACT

A method of manufacturing printed circuit boards. An environmentally safe method for manufactured printed circuit boards using additive technology provides a simple and exact transfer of conductor patterns. The novel method provides a selective ablation of a nucleation, B, applied to a substrate either by itself or together with a thin base layer, G, applied by chemical metal deposition. This ablation is done by electromagnetic radiation preferably with an excimer laser in those regions of the substrate that do not correspond to the conductor tracks and/or interlayer connections or through-connections to be formed later. Conductor material is subsequently built up by chemical and/or galvanic metal deposition.

20 Claims, 3 Drawing Sheets

METHOD OF MANUFACTURING PRINTED CIRCUIT BOARDS

BACKGROUND OF THE INVENTION

The invention is directed to a method of manufacturing printed circuit boards in additive technology.

In constructing printed circuits or printed circuit boards, a fundamental distinction is made between the wide-spread subtractive technology which removes copper not required for conductor tracks by etching and the additive technology which metal-laminated substrates or base materials only applies conductor material from baths where the conductor tracks are required on substrates coated with adhesion promoters. Combinations of these methods are also standard. For example, additive methods are used in the interlayer connection, i.e. copper coating of the wall of a hole in the conductor patterns produced subtractively and which are present on both sides of the substrate. In semi-additive technology, the interconnects are constructed by galvanic reinforcement on thin base layers deposited in a currentless fashion and the remainder of the base layer is in turn removed by etching, i.e. subtractively (cf, AEG-Telefunken Handbuecher, Volume 22, "Kunststoffe in der Elektrotechnik" 1979, page 36).

Transferring the conductor pattern with the use of a laser in the manufacture of printed circuit boards in fully additive technology is known from the German periodical "Galvanotechnik" 77, (1986), Number 1, pages 51 through 60. The following transfer mechanisms were considered and investigated:
Direct excitation of the substrate surface or of an adhesion promoter with the laser beam;
Thermic or photochemical excitation or deactivation of an activator layer with the laser beam;
Initiation and acceleration of the metal deposition without external current or of the electro-deposition with the thermal energy of the laser beam.
Of the transfer mechanisms investigated, a Cr (III) layer activation system seemed most suitable for further optimization.

SUMMARY OF THE INVENTION

The present invention is based on the object of creating an environmentally safe method for manufacturing printed circuit boards using additive technology that guarantees a simple transfer of even extremely fine conductor structures with a good adhesive base and also presents no problems in the manufacture of interlayer connections.

The present invention is based on the recognition that a negative image of the conductor tracks can be generated by ablation with electro-magnetic radiation, whereby the nucleation, the activated nucleation or a thin surface coating of chemically applied metal can be selectively eroded without a significant deterioration of the substrate surface. Metallization can then no longer occur in the region of influence of the electromagnetic radiation by the following method steps. While preserving the advantages of additive technology, a transfer of a conductor pattern that is especially simple to realize can be undertaken with electromagnetic radiation in the method of the present invention. The metallization of interlayer connections likewise present no difficulties in view of the generation of a negative conductor image. It should also be emphasized that the image structuring of the present invention by electromagnetic radiation also permits simple manufacture of 3-dimensional, injection molded printed circuit boards.

The use of $PdCl_2$-$SnCl_2$ as nucleation provides especially good results in the following, selective ablation. The use of palladium-organic compounds as nucleation likewise is especially advantageous. Such palladium-organic compounds are commercially available in baths for additive technology.

According to a further, preferred development of the present invention, the ablation is undertaken following the application of the nucleation and preceding the activation. In addition to a reduction in the quantity of the baths required, environmental protection is also take into consideration.

For substrates composed of fiberglass-reinforced polyether imide, the surface is at most only slightly deteriorated due to ablation. Fiberglass-reinforced polyether imide is especially well-suited for the manufacture of 3-dimensional, injection molded printed circuit boards.

The use of an ultraviolet (UV) laser has proven especially beneficial in view of the photon energy required for the ablation of the nucleation, of the activated nucleation or of the thin base layer, whereby the advantages of laser image transfer can also be realized. The ablation with the assistance of a pulsed excimer laser provided the best results.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
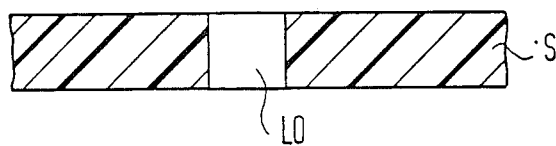
FIGS. 1 through 5 are cross-sectional views showing various method stages in the inventive manufacture of printed circuit boards.

The substrate S shown in FIG. 1 is a portion of a base material for a 3-dimensional, injection molded printed circuit board having injected holes LO. Thermal plastics resistant to high-temperatures are especially suited as materials for such printed circuit boards. Fiberglass-reinforced polyether imide is used in the described exemplary embodiment.

In order to increase adhesion of the conductor tracks and interlayer connects or through-connections to be applied later, the substrate S shown in FIG. 1 is first pickled and subsequently cleaned. Commercially available baths are used both for the pickling as well as for cleaning the substrate S, whereby the pickling bath was specifically adapted to the material, polyether imide.

Figure 2:
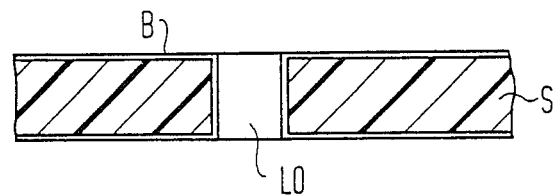

The nucleation of the substrate S followed the pickling and cleaning, this being shown as a thin layer, B, in FIG. 2. It may be seen that a nucleation B was applied to the surface of the substrate and to the walls of the holes LO. The nucleation B was applied by dipping the substrate S into a PdCl$_2$-SnCl$_2$ bath. However, commercially available baths of palladium-organic compounds also are suitable for applying the nucleation B.

Figure 3:
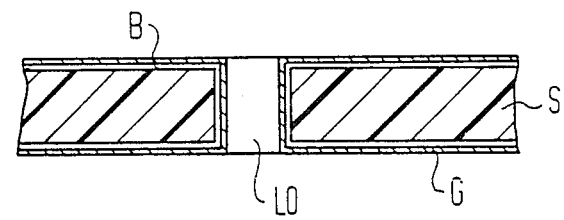

The nucleation B is activated after the application thereof. This involves a reducing or accelerating that is standard in additive technology. According to FIG. 3, an extremely thin base layer G applied in a commercially available, currentless copper bath coats the surface of the substrate and the walls of the holes LO.

Figure 4:
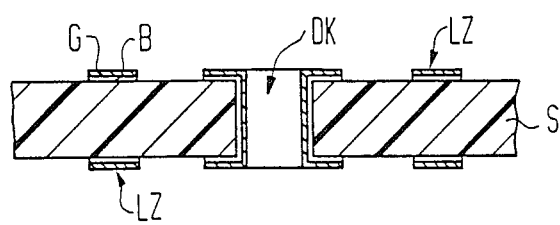
Figure 5:
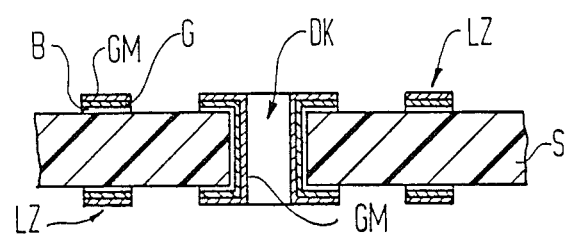

After the application of the thin base layer G, the thin base layer G is in turn removed in those regions of the substrate that do not correspond to the conductor tracks LZ and to the interlayer connections or through-connections DK (see FIG. 4) to be formed later. The base layer G that corresponds to the generation of a negative conductor pattern is selectively removed by ablation with electromagnetic radiation. In this ablation that shall be set forth in greater detail later with reference to FIG. 15, the nucleation B is in turn simultaneously removed in those regions of FIG. 4 that do not correspond to the conductor tracks LZ or to the interlayer connections or through-connections DK to be formed later. The electro-deposited metal deposited in the region of the conductor tracks LZ and interlayer connections DK from a commercially available copper bath is referenced GM in FIG. 5.

Figure 6:
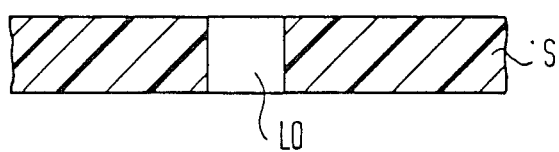
FIGS. 6 through 10 are cross-sectional views showing a first modification of the method disclosed in FIGS. 1 through 5.
Figure 7:
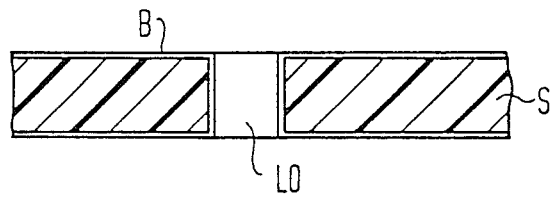
Figure 8:
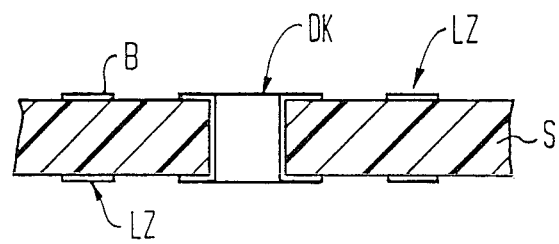

In the modification of the method disclosed with reference to FIGS. 6 through 10, the base material is again formed by the substrate S with holes LO shown in FIG. 6, a nucleation B then being again applied thereto in accordance with FIG. 7.

Before or after the activation of the nucleation B, the nucleation B is selectively removed by ablation with electro-magnetic radiation. According to FIG. 8, the nucleation B then only remains in the regions of the conductor tracks LZ and of the interlayer connections or through-connections DK to be formed later.

Figure 9:
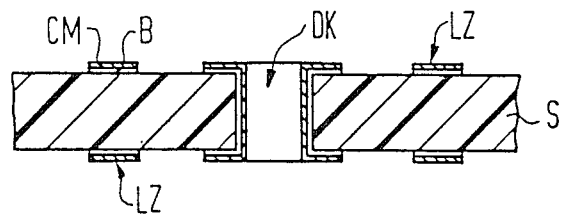

According to FIG. 9, a thin layer of chemically deposited metal CM is then applied following the selective ablation of the nucleation B. The metal CM is applied in the region of the conductor tracks LZ and of the interlayer connections or through-connections DK. The metal CM is again copper deposited in a currentless fashion.

Figure 10:
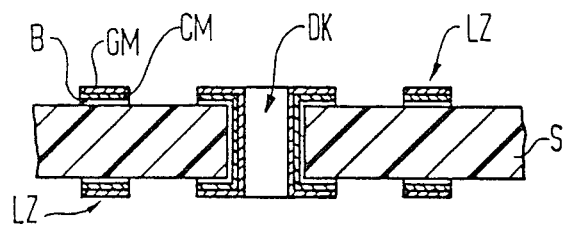

According to FIG. 10, the conductor tracks LZ and the interlayer connections or through-connections DK are galvanically reinforced, whereby the electro-deposited metal is again referenced GM.

Figure 11:
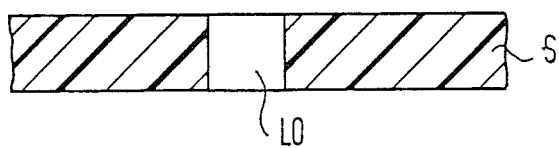
FIGS. 11 through 14 are cross-sectional views showing a second modification of the method disclosed in FIGS. 1 through 5.
Figure 12:
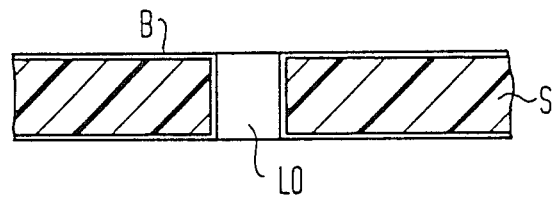
Figure 13:
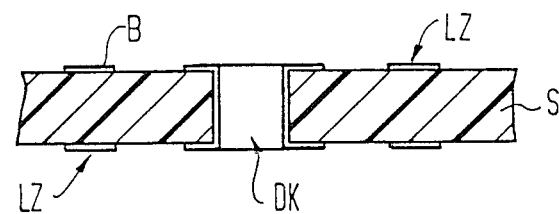

The modification of the method disclosed with reference to FIGS. 11 through 14 again uses substrate S with holes LO shown in FIG. 11, a nucleation B again being applied thereto according to FIG. 12. Before or after the activation of the nucleation B, the nucleation B is then again selectively removed by ablation with electromagnetic radiation. The remaining nucleation B in the region of the conductor tracks LZ and of the interlayer connections or through-connections DK is shown in FIG. 13.

Figure 14:
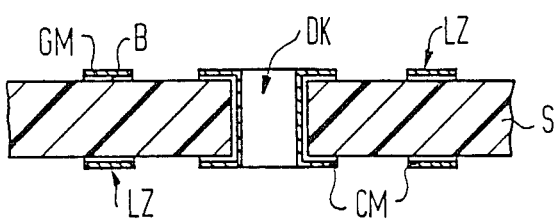

According to the FIG. 14, the conductor tracks LZ and the interlayer connections or through-connections DK are then formed immediately by chemical metal deposition following the selective ablation of the nucleation B. The chemically deposited metal layer is again referenced CM in FIG. 14. The chemically deposited metal CM is gain a thick copper-plating deposited from a commercially available copper bath in a currentless fashion.

Figure 15:
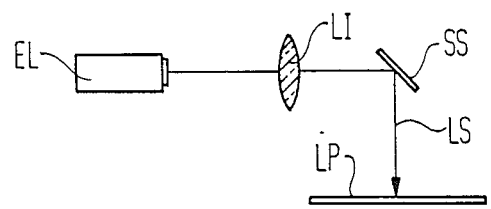
FIG. 15 is a schematic illustration of an arrangement for laser image transfer.

FIG. 15 shows a schematic illustration of an arrangement for laser image transfer. An excimer laser EL is provided whose laser beam LS is steered onto the printed circuit board LP via a lens LI and via an oscillating mirror SS. This generates a negative conductor pattern on the printed circuit board LP. The excimer laser EL has a wave length of $\lambda = 248$ nm. An energy setting of 400 m$^J$ per pulse at a 1 Hz repetition rate is used for a faultless, selective ablation of the nucleation B and of the base layer G according to FIG. 3 or of the nucleation B according to FIGS. 7 or 12. About 0.5 microns of the layers are eroded per laser pulse.

Instead of the arrangement schematically shown in FIG. 15, the excimer laser EL can also be followed by a pattern generator. A lens is then arranged between the pattern generator and the printed circuit board. In this case, the image structuring then occurs on the basis of appropriate dislocations and rotations of the printed circuit board relative to the pattern generator. Such a laser image transfer using a pattern generator can also be advantageously utilized in the mass production of injection molded printed circuit boards.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for the manufacture of printed circuit boards using additive technology, wherein conductor material is applied onto an electrically insulating substrate by nucleation, activation and by at least chemical metal deposition of chemical and galvanic metal deposition, comprising:

applying by chemical metal deposition a nucleation, B, over the substrate;

removing by a ablation with electromagnetic radiation the nucleation, B, in regions of the substrate that do not correspond to electrically conductive paths; and applying the conductor material to the electrically conductive paths.

2. The method according to claim 1, wherein PdCl$_2$-SnCl$_2$ is used as nucleation, B.

3. The method according to claim 1, wherein a palladium-organic compound is used as nucleation, B.

4. The method according to claim 1, wherein ablation is done after the application of the nucleation, B, and before activation of the nucleation, B.

5. The method according to claim 1, wherein a substrate of fiberglass-reinforced polyether imide is used.

6. The method according to claim 1, wherein the ablation is done with the use of a UV laser.

7. The method according to claim 6, wherein the ablation is done with the use of an excimer laser.

8. The method according to claim 7, wherein the excimer laser is a pulse excimer laser.

9. The method according to claim 1, wherein the method further comprises after applying the nucleation, B, applying by chemical metal deposition a thin base layer, G, and removing by ablation the thin base layer, G, along with the nucleation, B, in regions of the substrate that do not correspond to conductor tracks and interlayer connections.

10. The method according to claim 1, wherein the conductor material is applied by chemical metal deposition.

11. The method according to claim 1, wherein the conductor material is applied by galvanic metal deposition.

12. The method according to claim 1, wherein the electrically conductive paths are conductor tracks.

13. The method according to claim 1, wherein the electrically conductive paths are interlayer connections.

14. The method according to claim 1, wherein the electrically conductive paths are conductor tracks and interlayer connections.

15. A method for the manufacture of printed circuit boards using additive technology comprising:
    providing an electrically insulating substrate;
    applying by chemical metal deposition a nucleation, B, over the substrate;
    apply by chemical metal deposition a thin base layer, G, over the nucleation, B;
    removing by ablation with electromagnetic radiation the thin base layer, G, and the nucleation, B, in regions of the substrate that do not correspond to conductor tracks and interlayer connections;
    applying conductor material over the remaining thin base layer, G.

16. The method according to claim 15, wherein the conductor material is applied by chemical metal deposition.

17. The method according to claim 15, wherein the conductor material is applied by galvanic metal deposition.

18. The method according to claim 15, wherein $PdCl_2$-$SnCl_2$ is used as nucleation, B.

19. The method according to claim 15, wherein a palladium-organic compound is used as nucleation, B.

20. The method according to claim 15, wherein the ablation is done with a pulse excimer laser.

* * * * *